United States Patent
Honda

(10) Patent No.: US 10,148,061 B2
(45) Date of Patent: Dec. 4, 2018

(54) OPTICAL AMPLIFYING SYSTEM AND METHOD OF CONTROLLING THE SAME

(71) Applicant: SUMITOMO ELECTRIC DEVICE INNOVATIONS, INC., Yokohama-shi, Kanagawa (JP)

(72) Inventor: Masahiro Honda, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 15/704,476

(22) Filed: Sep. 14, 2017

(65) Prior Publication Data

US 2018/0076595 A1 Mar. 15, 2018

(30) Foreign Application Priority Data

Sep. 15, 2016 (JP) ................. 2016-180918

(51) Int. Cl.
| | |
|---|---|
| *H01S 3/00* | (2006.01) |
| *H01S 5/024* | (2006.01) |
| *H01S 3/13* | (2006.01) |
| *H01S 5/50* | (2006.01) |
| *H01S 5/026* | (2006.01) |
| *H01S 5/00* | (2006.01) |
| *H01S 5/022* | (2006.01) |
| *H01S 5/068* | (2006.01) |

(Continued)

(52) U.S. Cl.
CPC ........ *H01S 5/02415* (2013.01); *H01S 3/1301* (2013.01); *H01S 5/0265* (2013.01); *H01S 5/02446* (2013.01); *H01S 5/50* (2013.01); *H01S 5/005* (2013.01); *H01S 5/02216* (2013.01); *H01S 5/02248* (2013.01); *H01S 5/02276* (2013.01); *H01S 5/02284* (2013.01); *H01S 5/0683* (2013.01); *H01S 5/06804* (2013.01); *H01S 5/12* (2013.01)

(58) Field of Classification Search
CPC ....... H01S 5/02415; H01S 5/50; H01S 3/1301
USPC ........................................................ 359/337
See application file for complete search history.

(56) References Cited

U.S. PATENT DOCUMENTS

| | | | | |
|---|---|---|---|---|
| 8,654,803 B2 * | 2/2014 | Hayakawa | ............. | B82Y 20/00 372/21 |
| 9,001,852 B1 * | 4/2015 | Urata | ................... | H01S 5/02415 372/20 |

(Continued)

FOREIGN PATENT DOCUMENTS

| | | |
|---|---|---|
| JP | 1998-209542 | 8/1998 |
| JP | 2010-209542 | 8/1998 |

(Continued)

*Primary Examiner* — Mark Hellner
(74) *Attorney, Agent, or Firm* — Smith, Gambrell & Russell, LLP

(57) ABSTRACT

An optical amplifying system is disclosed. The optical amplifying system includes a thermo-electric cooler (TEC), and a semiconductor laser diode (LD) mounted on the TEC. The semiconductor LD generating a modulated optical signal with a wavelength that depends on the temperature of the LD as controlled by the TEC. The optical amplifying system further includes a semiconductor optical amplifier (SOA) that amplifies the modulated optical signal. A feature of the optical amplifying system is that the temperature of the SOA is higher than that of LD.

5 Claims, 15 Drawing Sheets

(51) Int. Cl.
  *H01S 5/0683* (2006.01)
  *H01S 5/12* (2006.01)

(56) References Cited

U.S. PATENT DOCUMENTS

2013/0170019 A1   7/2013  Teranishi
2015/0103853 A1*  4/2015  Kurobe .................... H01S 5/50
                                                    372/34

FOREIGN PATENT DOCUMENTS

JP   2010-239051   10/2010
JP   2013-149949    8/2013

\* cited by examiner

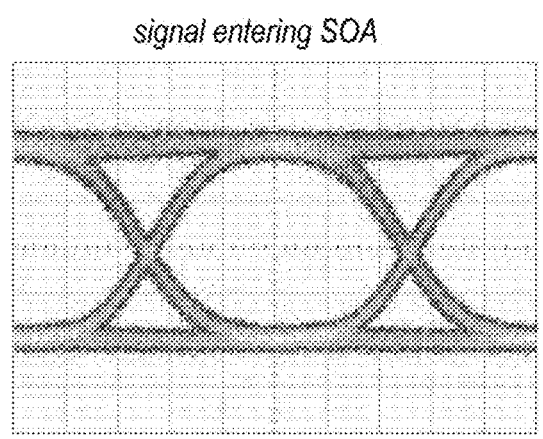
Fig. 13A — signal entering SOA
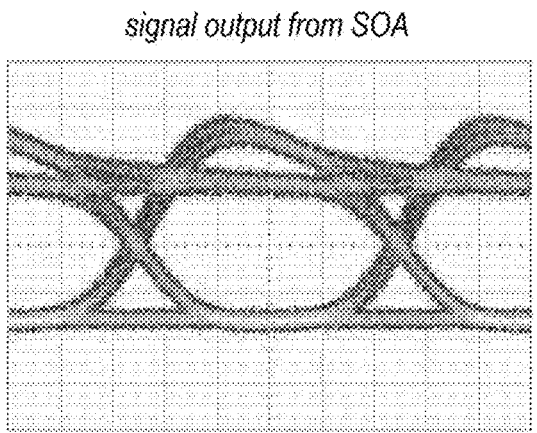
Fig. 13B — signal output from SOA ISOA=200 mA
T=38°C ISOA=300 mA
T=47°C ISOA=400 mA
T=58°C ISOA=500 mA
T=71°C

OPTICAL AMPLIFYING SYSTEM AND METHOD OF CONTROLLING THE SAME

BACKGROUND OF INVENTION

1. Field of the Invention

The present invention relates to an optical amplifying system and a method of controlling the optical amplifying system.

2. Background Arts

An optical amplifying system that optically amplifies light coming from a semiconductor laser diode (LD) has been well known in the field. A Japanese Patent laid open No. JP-H10-209542A has disclosed an optical amplifying system that shows a large optical gain by entering a pulsed optical signal with a width substantially equal to a rising time of the semiconductor optical amplifier (SOA). Another technique regarding an SOA has been disclosed in a Japanese Patent laid open No. JP2013-149949A, where an SOA shows an optical output signal with smaller distortion by biasing an SOA in a region where optical power output from an SOA decreases as increasing the bias. Still another Japanese Patent application laid open No. JP2010-239051A has disclosed that an optical device, which integrates an LD with an optical modulator on a semiconductor substrate common to the LD and the optical modulator and the LD in an active layer and the optical modulator in an optical absorbing layer are coupled with an optical waveguide with a width smaller than 1.35 µm, may suppress modes of higher degrees.

SUMMARY OF THE INVENTION

An aspect of the present invention relates to an optical amplifying system that comprises a thermos-electric cooler (TEC), a semiconductor laser diode, and a semiconductor optical amplifier (SOA). The semiconductor laser diode is mounted on the TEC and generates a modulated optical signal with a designed wavelength depending on a temperature of the semiconductor laser diode controlled by the TEC. The SOA amplifies the modulated optical signal output from the semiconductor laser diode. A feature of the optical amplifying system is that the temperature of the SOA is set higher than the temperature of the laser diode.

BRIEF DESCRIPTION OF THE DRAWINGS

The foregoing and other purposes, aspects and advantages will be better understood from the following detailed description of a preferred embodiment of the invention with reference to the drawings, in which:

FIG. 13A shows a waveform of an optical signal entering a semiconductor optical amplifier (SOA), while, FIG. 13B shows another waveform of an optical signal output therefrom;

DESCRIPTION OF EMBODIMENT

Next, embodiment according to the present invention will be described as referring to drawings. In the description of the drawings, numerals or symbols same with or similar to each other will refer to elements same with or similar to each other without duplicating explanations.

An optical amplifying system generally implements an electro-absorption modulating laser diode, which is often called as an EML, and a semiconductor optical amplifier (SOA) that amplifies laser light output from the EML.

An optical amplifying system generally comprises an optical source that generates an optical signal modulated by a modulating signal and an optical amplifier that amplifies the modulated optical signal. The optical source generally provides a semiconductor laser diode (LD) that generates laser light with a continuous wave (CW) configuration and an optical modulator that modulates the CW laser light depending on the electrical modulating signal. An LD type of distributed feedback (DFB) is often used as the CW laser light source, while an electro-absorption (EA) device is often implemented as the optical modulating device. Moreover, the EA device is usually integrated with the DFB-LD, where such a device is often called as the electro-absorption modulator laser diode (EML). Because of an EML may output a modulated optical signal with insufficient amplitude, the optical system implementing an EML usually accompanies an optical amplifier such as a semiconductor optical amplifier (SOA).

FIG. 13A shows a waveform of an optical signal entering asemiconductor optical amplifier (SOA), while, FIG. 13B shows another waveform of an optical signal output therefrom. Those waveforms, which are generally called as an eye-diagram, superpose respective events, namely, HIGH, LOW, and TRANSITION. When the eye diagram shows slim lines without superposing noises, the system showing such an eye diagram may have preferable transmission performance. On the other hand, when the eye diagram shows two or more lines for the respective events or expanded lines so as to squash the eyes, the system shows inferior performance of the signal transmission. FIGS. 13A and 13B were measured for an EML device where the DFB-LD is supplied with a driving current $I_{LD}$ of 90 mA, while the EA is supplied with a modulating signal with an amplitude of 2V, and the SOA is given by a driving current $I_{SOA}$ of 500 mA. As FIG. 13A indicates, the optical signal input to the SOA shows a preferable quality but that output therefrom was degraded with a substantial overshoots.

Figure 14:
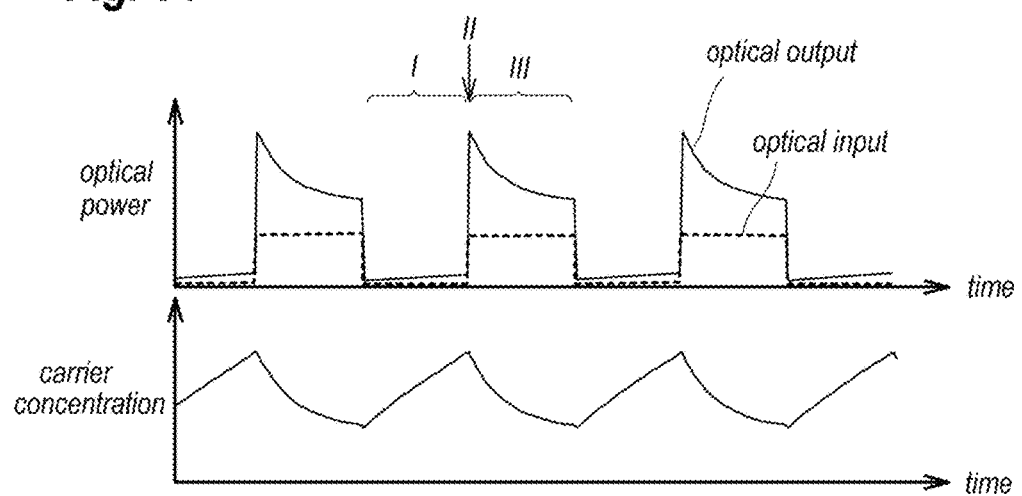
FIG. 14 explains one of reasons why an SOA degrades a waveform of a modulated optical signal, where an upper part shows power of an input signal by a broken line and that of an output signal by a solid line, while, a lower part in FIG. 14 schematically shows carrier concentration in the SOA.
Figure 15A:
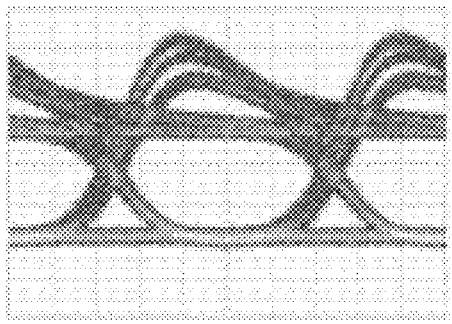
FIGS. 15A to 15D shows eye diagrams of the optical signals output from the SOA under various driving currents $I_{SOA}$ and temperatures.
Figure 15B:
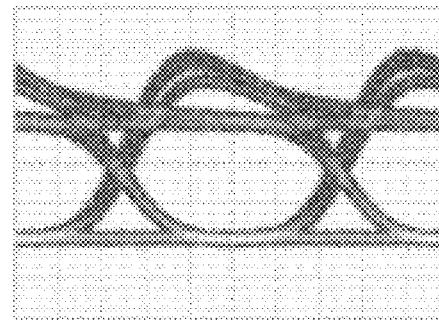
Figure 15C:
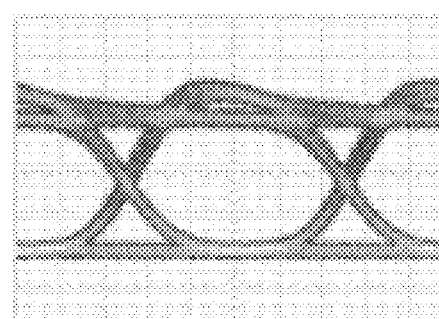
Figure 15D:
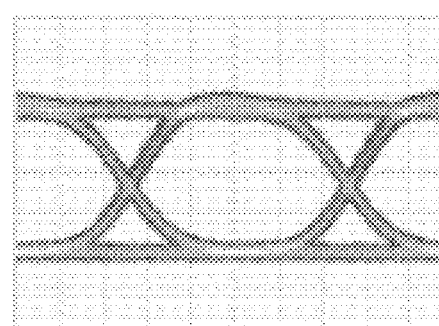

FIG. 14 explains one of the reasons why an SOA degrades a waveform of a modulated optical signal, where an upper part shows power of an input signal by a broken line and that of an output signal by a solid line, while, a lower part in FIG. 14 schematically shows carrier concentration in the SOA. When an input optical signal has relatively smaller power, which corresponds to a region I, the carrier concentration in the SOA increases because the SOA is unable to consume whole carries injected therein. Thereafter, with increasing power of the input optical signal under an increased carrier concentration, which corresponds to an instant II, the power of the output optical signal rapidly increases. During a period where the optical signal input to the SOA is large, which corresponds to a region III, the carrier concentration in the SOA gradually decreases to an equilibrium condition between the injection and the consumption, which decreases the power of the optical signal output from the SOA. Accordingly, the overshoot appearing in the eye diagram of FIG. 13B seems to be due to the increased carrier concentration during the small optical input power.

In order to suppress the overshoot appearing in the optical output signal from the SOA, the carrier concentration in the SOA is preferably suppressed. One technique for the reduction of the carrier concentration is to shorten life time of the carries by raising a temperature thereof. FIGS. 15A to 15D shows eye diagrams of the optical signals output from the SOA under various driving currents $I_{SOA}$ from 200 to 500 mA and temperatures from 38 to 71° C. Under those measurements shown in FIGS. 15A to 15D, the EA device was driven by the driving current $I_{LD}$ of 90 mA and the amplitude of the modulating signal $_VE_{AM}$ of 2V. Thus, as the temperature becomes higher, the optical signal output from the SOA becomes clear and fine with no overshoots and duplicated levels.

First Embodiment

Next, embodiment according to the present invention will be described as referring to drawings. In the description of the drawings, numerals or symbols same with or similar to each other will refer to elements same with or similar to each other without duplicating explanations.

Figure 1:
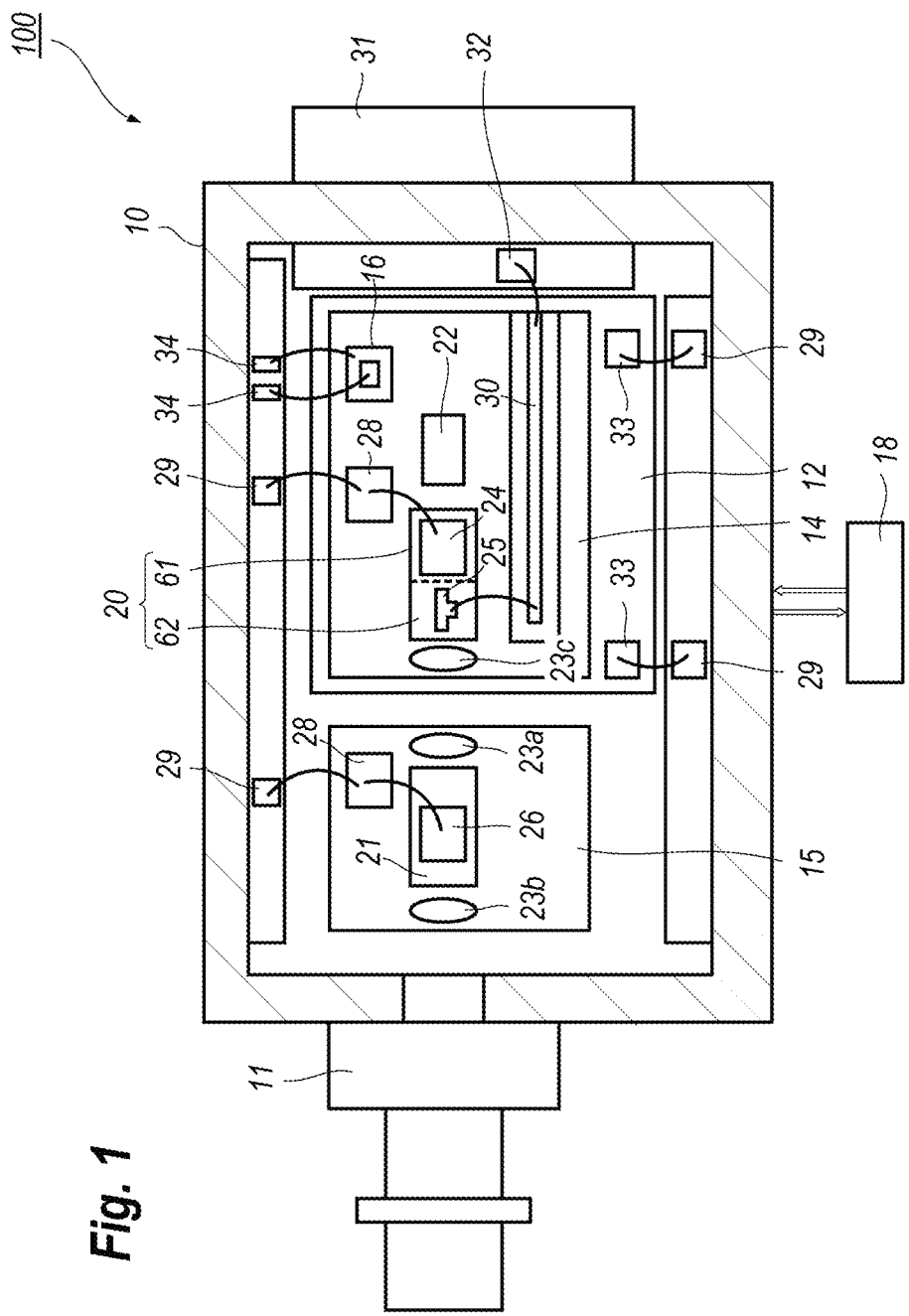
FIG. 1 is a plan view of an optical amplifying system according to the first embodiment of the present invention.

FIG. 1 is a plan view of an optical amplifying system 100 according to the first embodiment of the present invention. The optical amplifying system 100 includes a housing 10 that provides a receptacle 11 and a controller 18. The receptacle 11 receives an external fiber, which is not shown in figures. The housing 10 installs a thermo-electrical cooler (TEC) 12, and a couple of carriers, 14 and 15, where the former carrier 14 is mounted on the TEC 12, while, the latter carrier 15 is placed apart from the TEC 12.

Provided on the carrier 14 are an EML 20, a photodiode (PD) 22, and a lens 23c. The EML 20, as described later in the specification, includes a gain region 61 that generates laser light and a modulating region 62 that modulates the laser light provided from the gain region. The PD 22 monitors a magnitude of the laser light output from the EML 20. The other carrier 15 mounts a semiconductor optical amplifier (SOA) 21 and lenses, 23a and 23b, thereon. The SOA 21 couples with the EML 20 through the lens 23a. Also, the SOA 21 optically couples with the external fiber received in the receptacle 11 through another lens 23b. The SOA 21 amplifies the laser light output from the EML 20 and provides thus amplified laser light to the external fiber.

The gain region 61 of the EML 20 provides an electrode 24 that is electrically connected with a DC terminal 29 through bonding wires and a capacitor 28 for supplying power to the EML 20. The other electrode 25 in the modulating region 62 is connected with a signal terminal 32, which is provided on a board inserted within the housing 10, through bonding wires and an interconnecting pattern 30. The electrode 26 on the SOA 21 is connected with a DC terminal 29 through bonding wires and a capacitor 28. The electrodes 33 in the TEC are connected with the DC terminals 29 through bonding wires.

The controller 18 may provide a central processing unit (CPU), random access memories (RAMs), read-only memories (ROMs), and so on. The CPU 18 may control a driving current $I_{LD}$ supplied to the gain region 61, a driving voltage supplied to the modulating region 62, and another driving current $I_{SOA}$ supplied to the SOA 21. The controller 18 may further control a temperature of the TEC 12 by adjusting a DC current supplied to the TEC 12 based on an output of a thermistor 16 connected with the terminal 34 via a bonding wire, where the thermistor 16 is mounted on the carrier 14. The controller 18 may tune a wavelength of the laser light output from the EML 20 by adjusting the temperature of the TEC 12. For instance, the controller 18 may set and keep the temperature of the TEC 12 in 25° C. Also, the controller 18 may set the temperature of the SOA 21 so as to be higher than the temperature of the EML 20.

The sequence of the control by the controller 18 will be further specifically described. The controller 18 first sets the driving current $I_{LD}$ supplied to the gain region 61, the driving signal supplied to the modulating region 62, and the driving signal $I_{SOA}$ supplied to the SOA 21. Thereafter, the controller 18 sets the temperature of the TEC 12 such that the EML 20 generates the laser light with a preset wavelength. Finally, the controller sets the temperature of the SOA 21 so as to be different from the temperature of the EML 20, in an example, sets the temperature of the SOA 21 higher than the temperature of the EML 20.

Figure 2A:
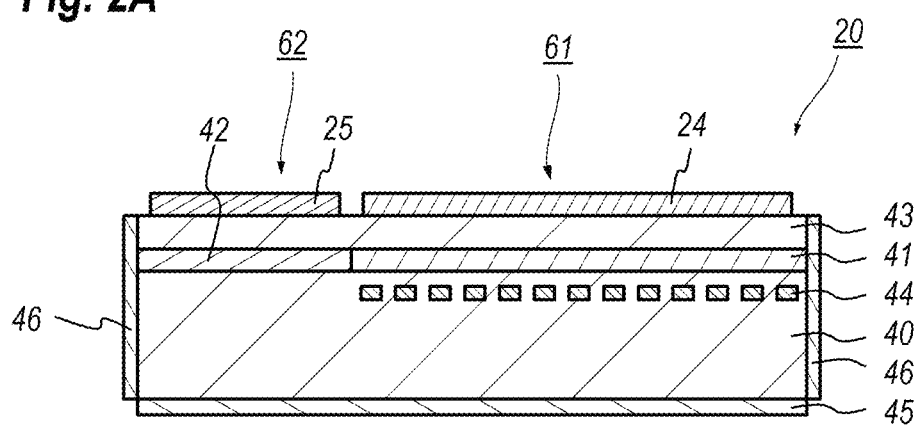
FIG. 2A shows a cross section of an electro-absorption modulating laser diode (EML) taken along an optical axis thereof.

FIG. 2A schematically shows a cross section of the EML 20 taken along an optical axis thereof. The EML 20 of the embodiment provides the gain region 61 that generates the laser light and the modulating region 62 that modulates the laser light, where the gain region 61 and the modulating region 62 are integrated on a substrate 40 made of indium phosphide (InP), and where the substrate 40 is common to the gain region 61 and the modulating region 62. The gain region 61 includes an active layer 41 that generates the laser light, while, the modulating region 62 provides an absorbing layer 42 that is optically coupled with the active layer 41 in the gain region 61.

The EML 20 further provides an upper cladding layer 43 on the active layer 41 and the absorbing layer 42, where the upper cladding layer 43 is common in the gain region 61 and the absorbing layer 62. The semiconductor substrate 40 may show a function of a lower cladding layer. Accordingly, an optical confinement arrangement where the active layer 41 and the absorbing layer 42 may be regarded as a core; while, the upper cladding layer 43 and the substrate 40, where those layers, 43 and 40, have refractive indices smaller than refractive indices of the active layer 41 and the absorbing layer 42, may be regarded as cladding layers sandwiching the core, is configured. Provided inside of substrate 40 are iterating structures 44 each having gratings, where the gratings may determine the wavelength of laser light generated in the active layer 41. Thus the gain region 61 may operate as a distributed feedback (DFB) laser diode.

The substrate 40, the active layer 41, the absorbing layer 42, and the upper cladding layer 43 may be made of compound semiconductor materials such as indium gallium arsenic phosphide (InGaAsP), aluminum indium gallium arsenide (AlGaInAs), and multiple layers including those materials. Such quo-ternary compound materials are adjusted in the compositions thereof such that refractive indices of the core, namely, the active layer 41 and the absorbing layer 42, are higher than those of the upper cladding layer 43 and the substrate 40.

The gain region 61 provides the electrode 24 on the upper cladding layer 43, to which the driving current $I_{LD}$, which may be a DC current, is supplied for generating the laser light in the active layer 41. Also, the modulating region 62 provides the electrode 25 on the upper cladding layer 43 to which the driving signal, which may be an AC signal, for modulating the laser light is supplied. The substrate 40 provides an electrode 45 in the back surface thereof. The EML 20 provides in respective facets coatings 46.

Supplying the driving current $I_{LD}$ to the electrode 24 of the gain region 61 causes the laser light in the active layer 41. The laser light 41 propagates within the absorbing layer 42 in the modulating region 62 and modulated in the magnitude thereof by the modulating signal supplied to the electrode 25. The modulated laser light is externally output through the coating 46.

Figure 2B:
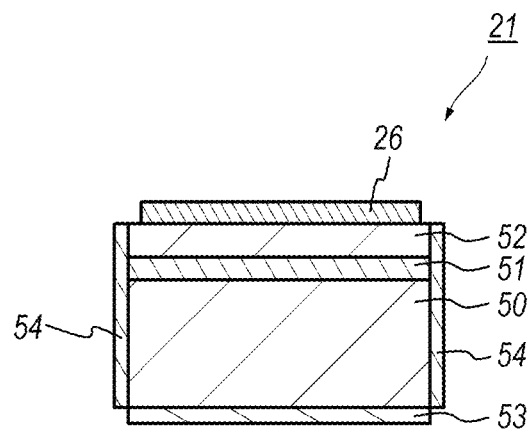
FIG. 2B shows a cross section of a semiconductor optical amplifier (SOA) also taken along an optical axis thereof.

FIG. 2B shows a cross section of the SOA 21 taken along the optical axis thereof. The SOA 21 provides an active layer 51 on the substrate 50. Provided on the active layer 51 is an upper cladding layer 52, while, the substrate 50 may show a function of the lower cladding layer. Thus, the optical confinement configuration by the core and the claddings sandwiching the core therebetween may be realized.

The substrate 50, the active layer 51, and the upper cladding layer 52 may be made of quo-ternary compound semiconductor materials such as InGaAsP, AlInGaAs, and multiple layers thereof. Those quo-ternary semiconductor materials in the compositions thereof are adjusted such that the refractive index of the active layer 51 becomes higher than those of the upper cladding layer 52 and the substrate 50.

Provided on the upper cladding layer 52 is an electrode 26 to which the driving current $I_{SOA}$ is suppled to amplify light entering the active layer 51. The SOA 21 may further provide coatings in respective facets thereof. Supplying the driving current $I_{SOA}$ to the electrode 26, the SOA 21, in the active layer 51 thereof, may amplify the laser light provided from the EML 20, and externally outputs the amplifier laser light through the coating 54.

The first embodiment of the present invention sets the EML 20 on the TEC 12 through the carrier 14, while, the SOA 21 outside of the TEC 12 through the other carrier 15. Even when the TEC 12 in the temperature thereof is adjusted such that the EML 20 may generate the laser light with the designed wavelength, the SOA 21 is substantially free from the change in the temperature of the TEC 12, but the temperature of the SOA 21 may be set higher by the driving current $I_{SOA}$ without increasing the driving current $I_{SOA}$. Thus, the SOA 21 may suppress the deformation caused in the modulated laser light output therefrom as securing the reliability of the SOA 21.

The controller 18 of the first embodiment may adjust the temperatures of the EML 20 and the SOA 21 such that the latter temperature is higher that the former temperature. Thus, two devices, 20 and 21, may be adjusted in the temperatures thereof so as to be independently adequate to the respective devices. The SOA 21 may suppress the deformation caused in the modulated laser light output therefrom as securing the reliability of the SOA 21.

Also, the controller 18 of the first embodiment may adjust the temperature of the TEC 12 such that the EML 20 may generate the laser light with the designed wavelength and the temperature of the SOA 20 may be higher than the temperature of the EML 20. Because the SOA 20 is substantially free from the variation in the temperature of the TEC 12, the first embodiment may set the temperature of the SOA 21 by the driving current $I_{SOA}$ as generating the laser light with the designed wavelength.

Second Embodiment

Figure 3:
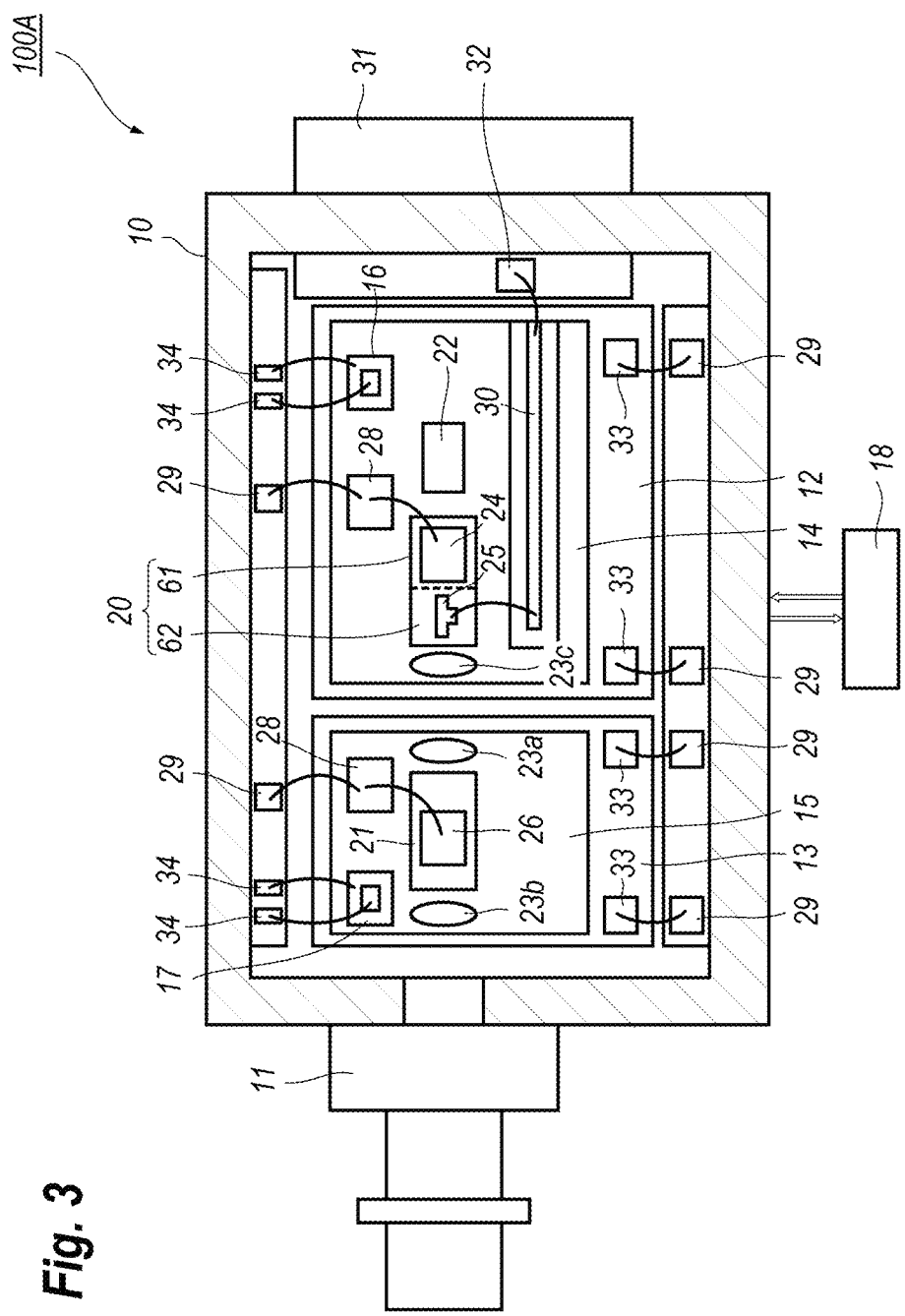
FIG. 3 is a plan view of another optical amplifying system according to the second embodiment of the invention.

FIG. 3 is a plan view schematically showing another optical amplifying system 100A according to the second embodiment of the present invention. The optical amplifying system 200 provides a carrier 15 on the TEC 13. The electrodes 33 of the TEC 13 are connected to the DC terminals 29. The controller 18 may also control a temperature of the TEC 13 in addition to aforementioned controls based on an output provided from a thermistor 17 that is mounted on the carrier 15 and connected to the DC terminals 34. The controller 18 controls the temperature of the TEC 12 such that the EML 20 may generate laser light with the designed wavelength, and also controls the other TEC 15 such that the SOA 21 in the temperature thereof becomes higher than the temperature of the EML 20.

Sequence for controlling the optical amplifying system shown in FIG. 3 will be described. The controller 18 first supplies the driving current $I_{LD}$ to the gain region 61 of the EML 20, the modulation signal also supplied to the modulating region 62 of the EML 20, and the driving current $I_{SOA}$ supplied to the SOA 21. Thereafter, the controller 18 controls the temperature of the TEC 12 such that the EML 20 may emit the laser light with the designed wavelength. Finally, the controller adjusts the driving current $I_{SOA}$ supplied to the SOA 21 again, and the controller 18 adjusts the temperature of the TEC 13 such that the temperature of the SOA 21 is higher than the temperature of the EML 20.

The optical amplifying system of the second embodiment mounts the EML 20 on the TEC 12, which is the first TEC, while, mounts the SOA 21 on the TEC 13, which is the second TEC. The EML 20 is mounted on the first TEC 12 through the carrier 14, and the SOA 21 is mounted on the second TEC 13 through the carrier 15. Thus, the TEC 12 may adjust the temperature of the EML 20, while, the TEC 13 may adjust the temperature of the SOA 21 independent of the temperature of the EML 20. Accordingly, the TEC 12 may adjust the temperature of the EML 20 such that the EML 20 may emit the laser light with the designed wavelength, but the temperature of the SOA 21 may be set higher than the temperature of the EML 20.

The first and second embodiments thus described concentrate on the EML 20 as the optical source, but the optical amplifying system may implement a direct modulating laser diode that emits a modulated light by the driving signal supplied to the electrode of the gain region.

Third Embodiment

The first and second embodiment concentrate on the arrangement where the EML 20 as an optical source is independent of the SOA 21, that is, the EML 20 and SOA 21 are not integrated on a common substrate. The third embodiment of the present invention has an arrangement where the EML 20 and the SOA 21 are integrated on the common substrate.

Figure 4:
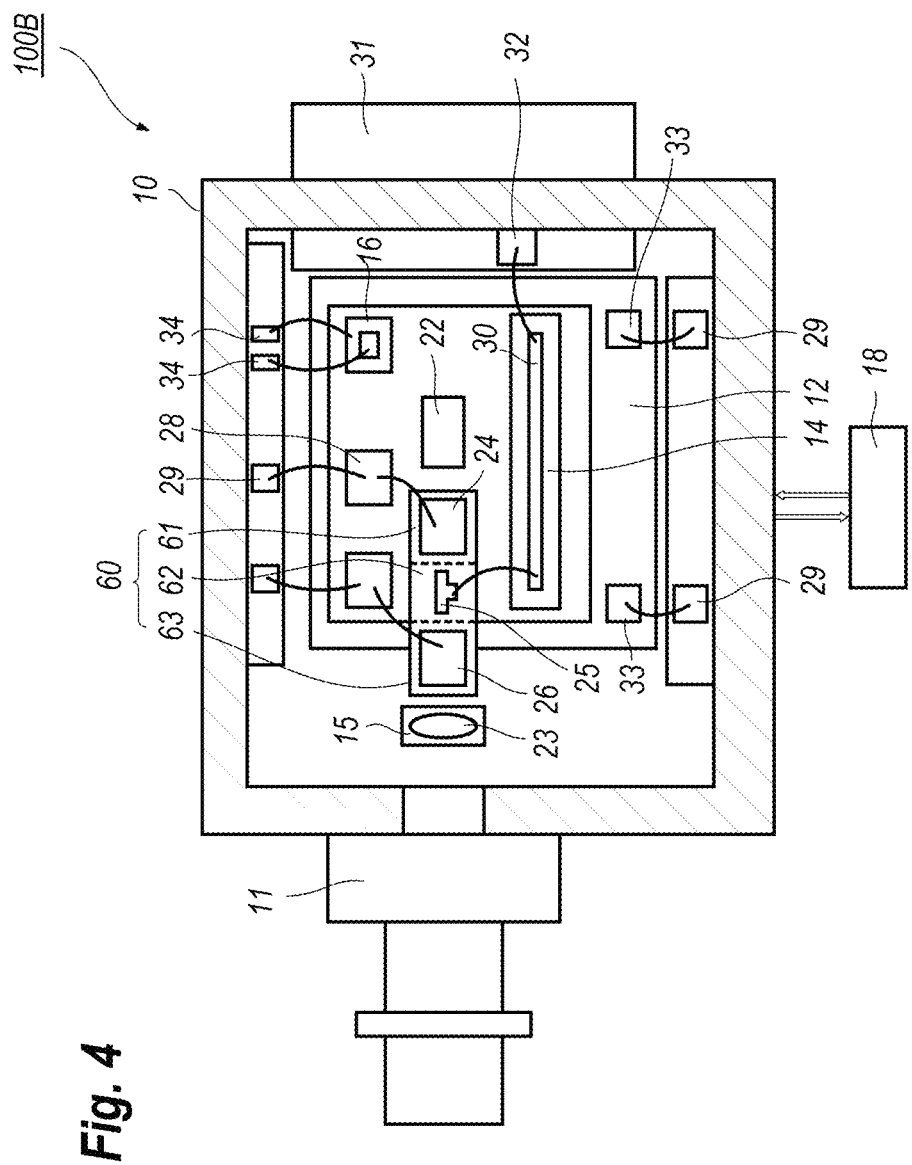
FIG. 4 is a plan view of still another optical amplifying system according to the third embodiment of the invention.

FIG. 4 is a plan view schematically illustrating the optical amplifying system 100B according to the third embodiment of the present invention. The optical amplifying system 100B shown in FIG. 4 implements a semiconductor laser element 60 mounted on the TEC 12 through the carrier 14. The semiconductor laser element 60 includes the gain region 61 that generate laser light, the modulating region 62 that modulates the laser light generated in the gain region 61, and an amplifying region 63 that amplifies the laser light modulated by the modulating region 62. The gain region 61 and the modulating region 62 correctively correspond to the EML 20 in the aforementioned embodiment, while, the amplifying region 63 corresponds to the SOA 21. A feature of the optical amplifying system shown in FIG. 4 is that the gain region 61 and the modulating region 62 are mounted on the TEC 12 through the carrier 14, but the amplifying region 63 is not overlapped with the TEC 12; that is, the gain region 61 and the modulating region 62 are fixed onto the carrier 14 but the amplifying region 63 is not fixed onto the carrier 14 but overhanging from the carrier 14. The carrier 15 only mounts the lens 23 through which the semiconductor laser element 60 optically couples with the external fiber secured within the receptacle 11. The controller 18 may control the optical amplifying system 100B by the procedures similar to those for the optical amplifying system 100 of the first embodiment. That is, the controller 18 may firstly adjust the temperature of the TEC 12 such that the semiconductor laser element 60 may emit the laser light with the designed wavelength. Also, the controller 18 may adjust the driving current $I_{SOA}$ supplied to the amplifying region 63 such that the temperature of the amplifying region 63 becomes higher than that of the gain region 61.

Figure 5:
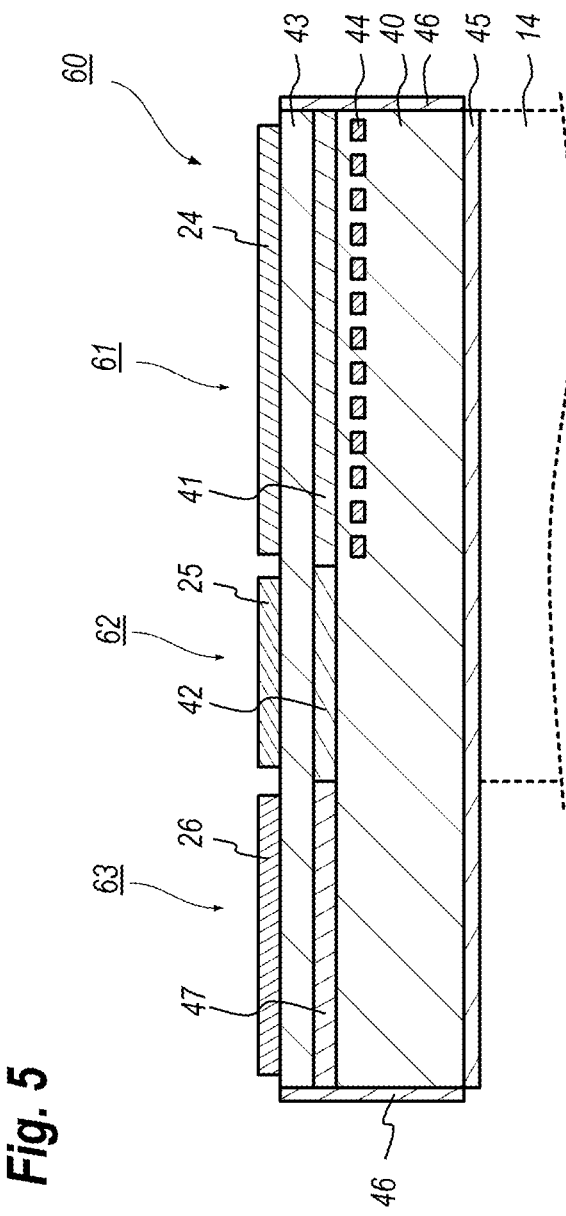
FIG. 5 shows a cross section of a semiconductor laser element implemented in the optical amplifying system shown in FIG. 4.

FIG. 5 shows a cross section of the semiconductor laser element 60 implemented in the optical amplifying system 100B of the third embodiment shown in FIG. 4. The semiconductor laser element 60 provides the gain region 61 that generates the laser light, the modulating region 62 that modulates the laser light, and the amplifying region 63 that amplifies the modulated laser light, where those regions, 61 to 63, are integrated on a common semiconductor substrate 40 made of, for instance, indium phosphide (InP). Provided on the common substrate are the active layer 41 in the gain region 61, the absorbing layer 42 in the modulating region 62, and the active layer 47 in the amplifying region 63. The active layers, 41 and 47, in the gain region 61 and the amplifying region 63 may be concurrently grown on the substrate 40; accordingly, those active layers, 41 and 47, may be made of material same with each other. The absorbing layer 42 optically couples with the active layer 47. Provided on the active layer 47 in the amplifying region 63 is the upper cladding layer 43 that is common to the upper cladding layer 43 in the gain region 61 and the modulating region 62. That is, the upper cladding layer 43 uniformly extends from the gain region 61 to the amplifying region 63. Providing on the upper cladding layer 43 in the amplifying region 63 is an electrode 26 to which the driving current $I_{SOA}$ is supplied thereto to amplify the modulated laser light.

Supplying the driving current $I_{LD}$ to the electrode 24 in the gain region 61, the active layer 41 in the gain region 61 may generate the laser light that propagates within the modulating region 62. Providing the modulation signal onto the electrode 25, the laser light coming from the gain region 61 is modulated in amplitude thereof. The modulated laser light enters the active layer 47 in the amplifying region 63 and is amplified therein by the driving signal $I_{SOA}$ supplied to the electrode 26 in the amplifying region 63. The modulated and amplified laser light may be output through the coating film 46 provided on the facets in the side of the amplifying region 63.

The optical amplifying system 100B according to the third embodiment provides the semiconductor laser element 60 that integrates the gain region 61, the modulating region 62, and the amplifying region 63 on the semiconductor substrate 40 common to those regions, 61 to 63. The gain region 61 and the modulating region 62 of the semiconductor laser element 60 overlap with the TEC 12, that is, those two regions, 61 and 62, are mounted on the TEC 12 through the carrier 14; but the amplifying region 63 of the semiconductor laser element 60 is not overlapped with the TEC 12, that is, the amplifying region 63 overhangs from the TEC 12. Thus, the amplifying region 63 becomes substantially free from the temperature of the gain region 61 and the modulating region 62; accordingly, the temperature of the amplifying region 63 may be effectively adjusted without increasing the driving current $I_{SOA}$ supplied to the amplifying region 63. The distortion appearing in the optical output coming from the amplifying region 63 may be suppressed without degrading the reliability of the amplifying region 63.

The controller 18 first adjusts the temperature of the TEC 12 such that the gain region may generate the laser light with the designed wavelength, then the temperature in the amplifying region to be higher than the temperature of the TEC 12. Because the amplifying region 63 has tolerance against the temperature of the TEC 12, the controller 18 may effectively set the temperature of the amplifying region higher than the temperature of the gain region 61.

In order to suppress the distortion caused in the waveform of the optical output, the amplifying region preferably overhangs from the carrier 14 by at least a half length of the amplifying region 63. The amplifying region is most preferable to overhang from the carrier by a full length thereof.

Fourth Embodiment

Figure 6:
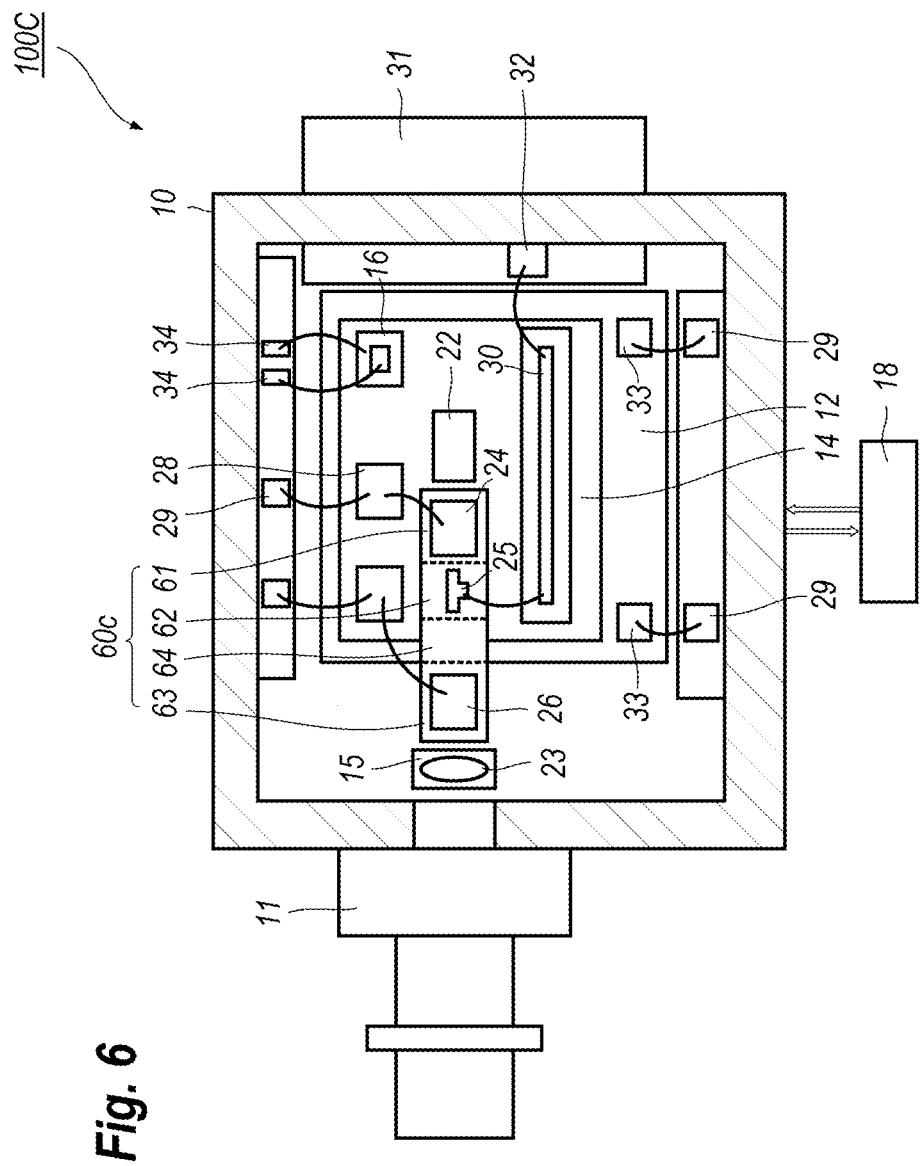
FIG. 6 is a plan view of still another optical amplifying system according to the fourth embodiment of the present invention.
Figure 7:
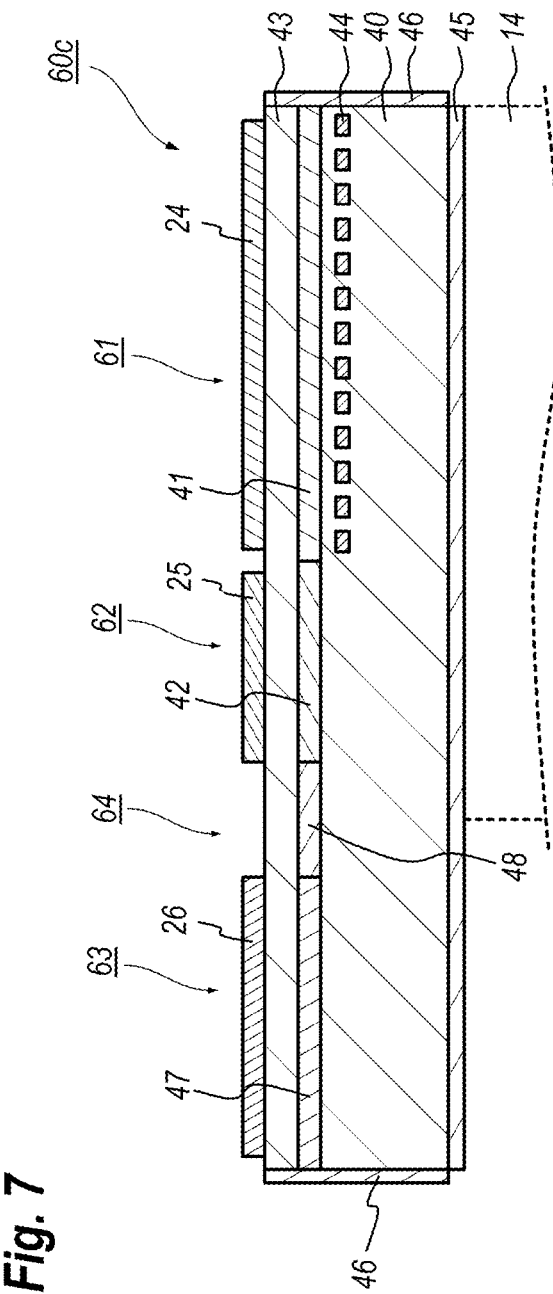
FIG. 7 shows a cross section of a semiconductor laser element implemented in the optical amplifying system shown in FIG. 6.

FIG. 6 is a plan view of an optical amplifying system 100C according to the fourth embodiment of the present invention, and FIG. 7 shows a cross section of a semiconductor laser element 60c that includes a waveguide region 64 between the modulating region 62 and the amplifying region 63. The waveguide region 64 provides a waveguide layer 48 on the substrate 40. The waveguide 48 may be made of ternary and/or qui-ternary compound semiconductor material, for instance, indium gallium arsenic phosphide (InGaAsP) in a bulk form with bandgap wavelength shorter than the wavelength of the laser light generated in the gain region 61. The absorbing layer 42 optically couples with the waveguide layer 48 at an interface between the modulating region 62 and the waveguide region 64. Also, the waveguide layer 48 optically couples with active layer 47 at an interface between the waveguide region 64 and the amplifying region 63. The waveguide region provides, on the waveguide layer 48, an upper cladding layer that is common to those in the gain region 61, the modulating region 62, and the amplifying region 63.

Because the semiconductor laser element 60c in the optical amplifying system 100C of the fourth embodiment provides the waveguide layer 48 between the absorbing layer 42 in the modulating region 62 and the active layer 47 in the amplifying region 63, and the waveguide layer 48 optically couples with the absorbing layer 42 and the active layer 47; a distance from the TEC 21 to the amplifying region 63 through the gain region 61 and the modulating region 62 becomes longer even when the gain region 61 and the modulating region 62 are mounted on the carrier 14. Accordingly, the amplifying region 63 is hard to be influenced from a variation of the temperature of the TEC 12, and the temperature of the SOA may be effectively raised without increasing the driving current $I_{SOA}$ supplied to the amplifying region 63. The arrangement of the fourth embodiment makes the reliability of the amplifying region 63 consistent with the reduction of the distortion caused in the output wavelength of the optical signal.

Fifth Embodiment

Figure 8:
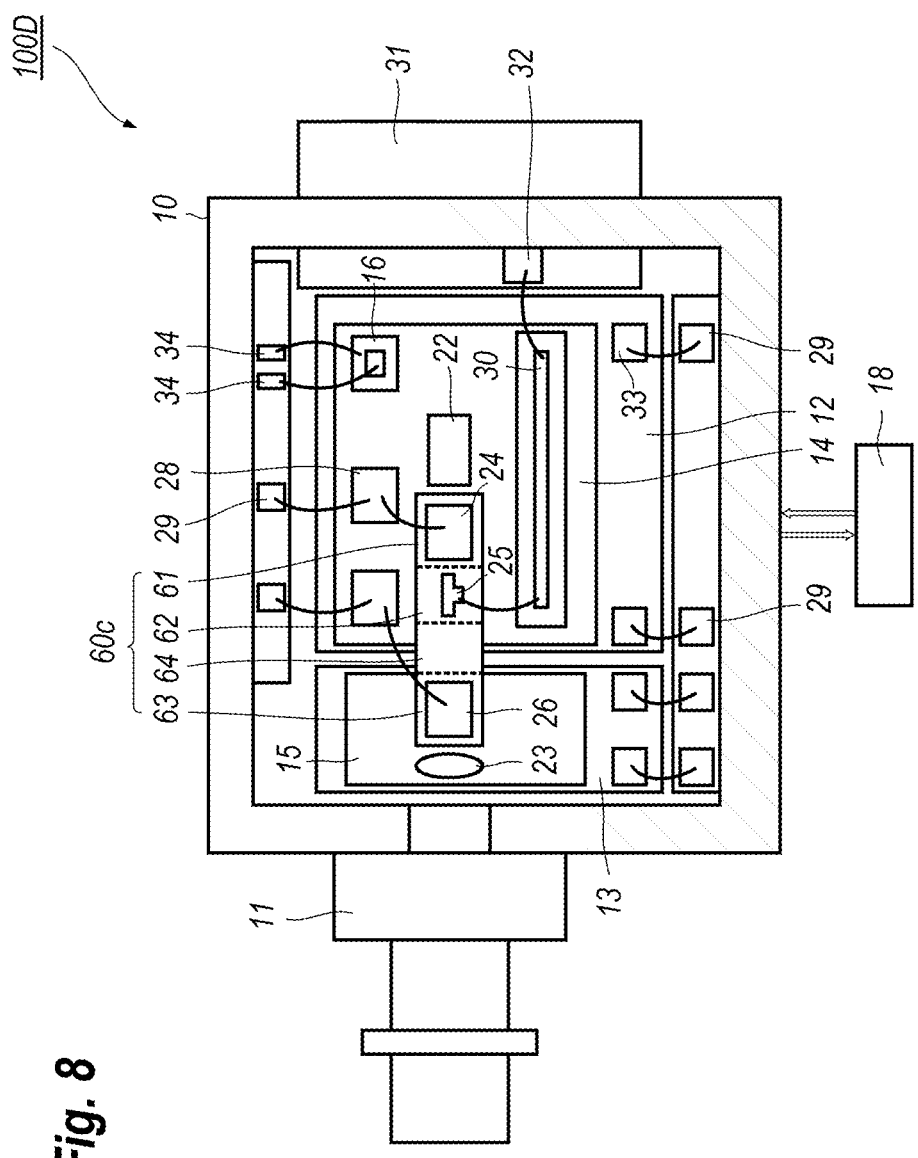
FIG. 8 is a plan view of still another optical amplifying system according to the fifth embodiment of the present invention.
Figure 9:
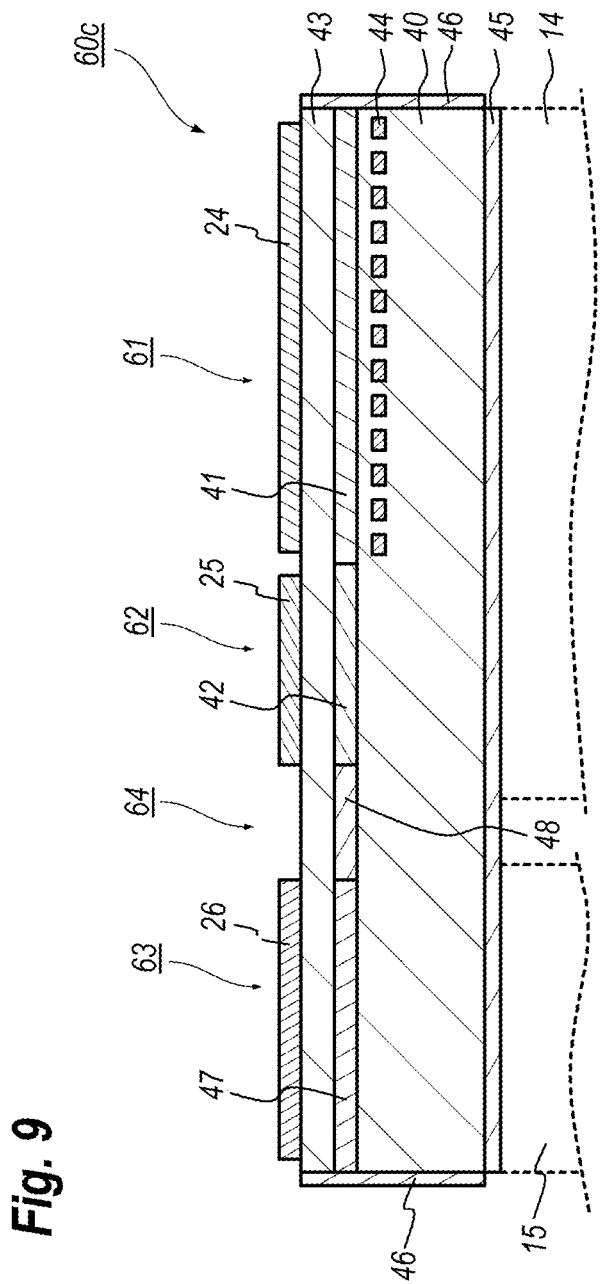
FIG. 9 shows a cross section of a semiconductor laser element in a state implemented in the optical amplifying system shown in FIG. 8.

FIG. 8 is a plan view of an optical amplifying system 100D of the fifth embodiment of the present invention, and FIG. 9 shows a cross section of the semiconductor laser element 60c implemented within the optical amplifying system 100D shown in FIG. 8. The optical amplifying system 100D of the fifth embodiment provides, inside of the housing 10, another TEC 13 in addition to the TEC 12. The TEC 13 mounts the carrier 15 thereon. The semiconductor laser element 60c is mounted across the carriers, 14 and 15. Specifically, the carrier 14 mounts the gain region 61 and the modulating region 62 in the semiconductor laser element 60c, while, the other carrier 15 mounts the amplifying region 63. The controller 18 controls the temperature of the former TEC 12 such that the gain region 61 may generate the laser light with the designed wavelength and also controls the latter TEC 13 such that the temperature of the amplifying region 63 becomes higher than that of the gain region 61.

The fifth embodiment of the present invention mounts the gain region 61 and the modulating region 62, which correspond to a semiconductor laser diode of the semiconductor laser element 60c, on the carrier 14, while, mounting the amplifying region 63 on the other carrier 15. Accordingly, the amplifying region 63 in the temperature thereof may be controlled independent of the semiconductor laser diode including the gain region 61 and the modulating region 62 that determines the wavelength of the laser light. Accordingly, the amplifying region 63 is prevented from being supplied with unnecessarily increased driving current $I_{SOA}$, which may secure the reliability of the amplifying region 63, and suppresses degradation in the output waveform.

The fifth embodiment shown in FIG. 8 mounts the amplifying region 63 on the carrier 15, which is different from the arrangement in the third and fourth embodiment where the amplifying region 63 overhangs from the carrier. Accordingly, the semiconductor laser element 60c of the fifth embodiment may enhance the reliability and mechanical tolerance.

From a viewpoint to suppress the degradation in the output waveform, the carrier 15 preferably is more than half of the amplifying region 63. An arrangement where the carrier 15 mounts a whole of the amplifying region 63 is best for the reliability and the controllability.

Sixth Embodiment

Figure 10:
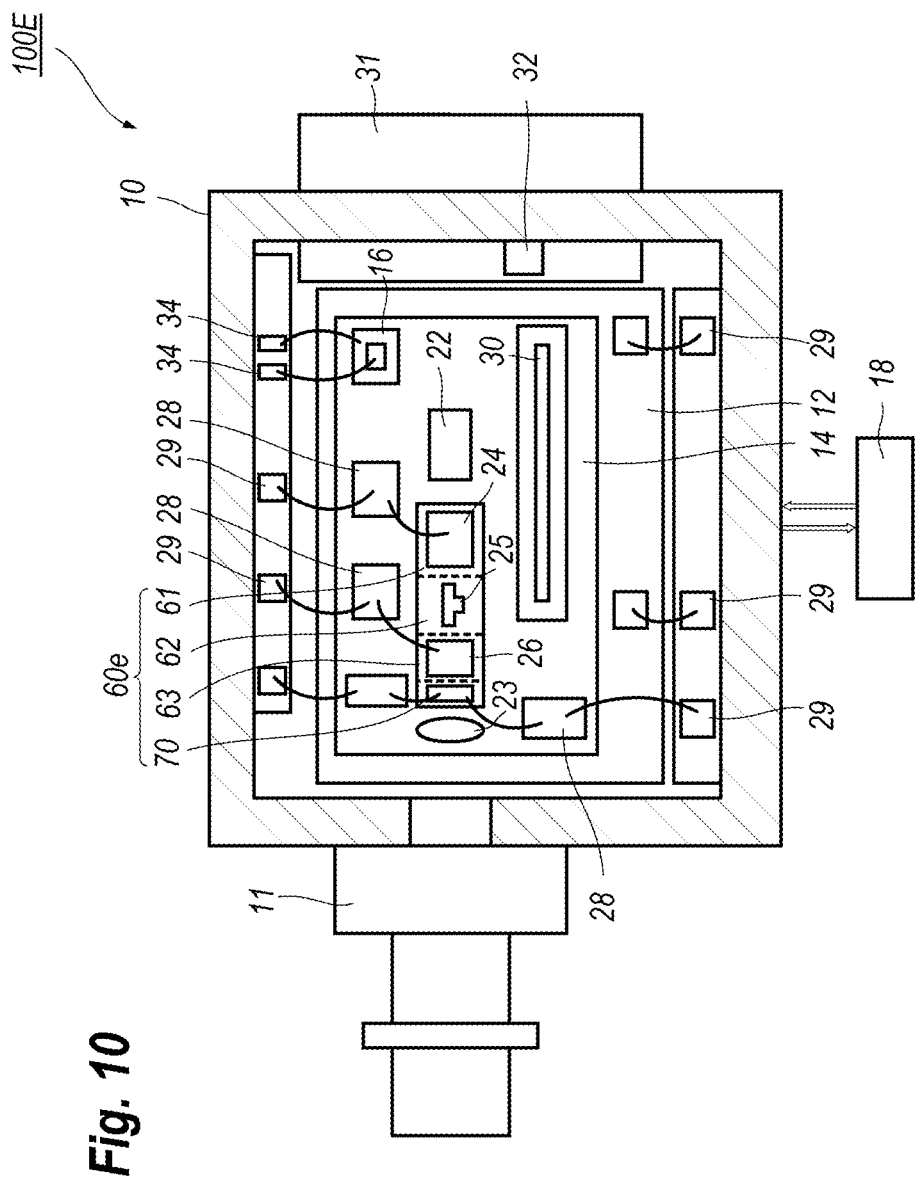
FIG. 10 is a plan view of still another optical amplifying system according the sixth embodiment of the present invention.
Figure 11:
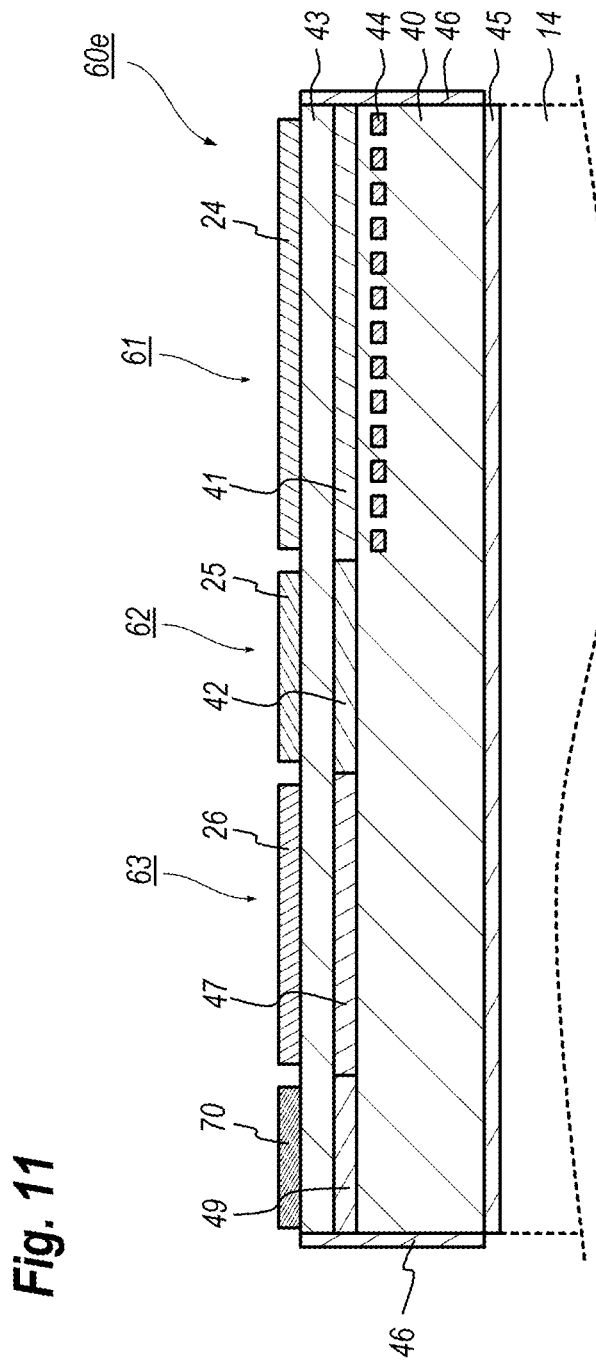
FIG. 11 shows a cross section of a semiconductor laser element implemented in the optical amplifying system shown in FIG. 10.

FIG. 10 is a plan view of still another optical amplifying system 100E according to the sixth embodiment of the invention, and FIG. 11 shows a cross section of a semiconductor laser element 60e implemented in the optical amplifying system 100E. In the amplifying system 100E of the six embodiment, the carrier 14 mounts a whole of the gain region 61, the modulating region 62, and the amplifying region 63 in the semiconductor laser element 60e. A feature of the sixth embodiment is that the semiconductor laser element 60e further provides a heater 70 next to the electrode 26 of the amplifying region 63. The heater 70 is supplied with a current from the DC terminal 29 through boding wires and a capacitor 28. The semiconductor laser element 60e provides a waveguide layer 49 beneath the heater 70 on the semiconductor substrate 40, where the waveguide layer 49 may be made of ternary and/or quoternary compound semiconductor materials having bandgap wavelength shorter than the wavelength of the laser light, for instance, a bulk of indium gallium arsenic phosphide (InGaAsP). The waveguide layer 49 optically couples with the active layer 47 at the interface between the amplifying region 63 and a region providing the heater 70. The semiconductor laser element 60e provides the upper cladding layer 43 that is common to the gain region 61, the modulating region 62, the amplifying region, and the region forming the heater 70. That is, the heater 70 is provided on the upper cladding layer 43. The controller 18, in addition to the function of determining the wavelength of the laser light by controlling the temperature of the carrier 14 through the TEC 12, may control the temperature of the heater 70 such that the temperature of the amplifying region 63 becomes higher than the temperature of the gain region 61.

Specifically, the controller first sets the driving current $I_{LD}$ supplied to the gain region and the driving current supplied to the $I_{SOA}$ supplied to the amplifying region 63. Then, the controller 18 controls the temperature of the TEC 12 such that the gain region 61 generates the laser light with the designed wavelength. The controller 18 further adjusts the temperature of the amplifying region 63 by controlling power supplied to the heater 70 such that the temperature of the amplifying region 63 becomes higher than that of the gain region 61.

The sixth embodiment provides, in the semiconductor laser element 60e, the heater in addition to the gain region 61, the modulating region 62, and the amplifying region 63, where the heater raises the temperature of the amplifying region 63. The carrier 14, namely, the TEC 12 mounts the whole of the semiconductor laser element 60e. Accordingly, the temperature of the amplifying region 63 may be set higher than the temperature of the gain region 61. The arrangement above described may make the long-term reliability of the amplifying consistent with the determination of the wavelength of the laser light, because the amplifying region 63 becomes unnecessary to be supplied with an excess driving current for increasing the temperature thereof. Also, comparing with the arrangement of the fifth embodiment where the second TEC 13 mounts the amplifying region 63, the arrangement of the sixth embodiment may shorten a distance from the active layer 47 in the amplifying region 63; the heater 70 may vary the temperature of the active layer 47 promptly and effectively.

The sixth embodiment mounts the whole of the semiconductor element 60e, this arrangement for the semiconductor element 60e makes mechanical tolerance higher compared with the third and fourth embodiment where the amplifying region 63 overhangs. Also, the heater 70 is put between the electrode 26 in the amplifying region 63 and the face in the amplifying region 63, which automatically set the heater 70 apart from the gain region 61 and the modulating region 62, that is, the heater 70 causes less influence in the gain region 61 and the modulating region 62.

Figure 12:
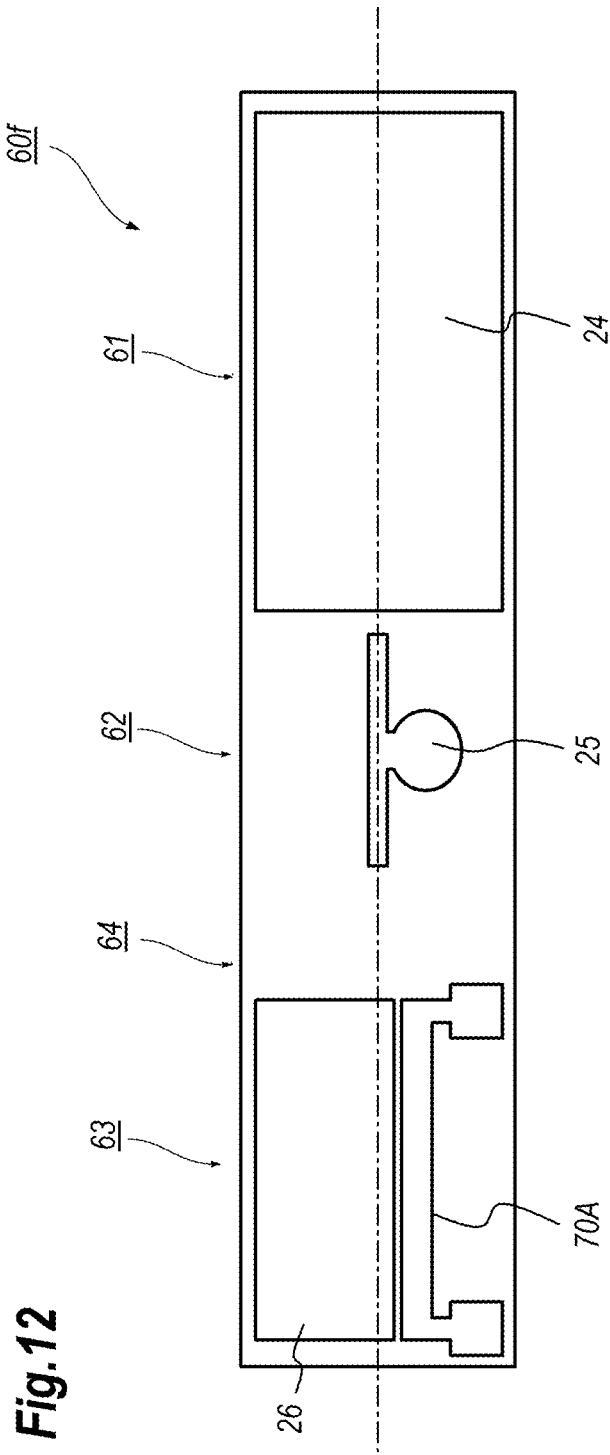
FIG. 12 is a plan view of a semiconductor laser element implemented in the optical amplifying system shown in FIG. 10, which is modified from the semiconductor laser element shown in FIG. 11.

The position of the heater 70 is not restricted to those of the aforementioned embodiment, however. For instance, FIG. 12 shows another arrangement of the heater 70 where the heater may be arranged along the electrode 26 in the amplifying region 63 as shown in FIG. 12. Also, even when the semiconductor laser element 60e provides the heater 70, the semiconductor laser element may provide the waveguide region 64 between the modulating region 62 and the amplifying region 63. This arrangement also prevents heat generated in the heater 70 from propagating to the gain region 61 and the modulating region 62.

The present application claims the benefit of priority of Japanese Patent Application No. 2016-180918, filed on Sep. 15, 2016, which is incorporated herein by reference.

What is claimed is:

1. An optical amplifying system, comprising:
a thermoelectric cooler (TEC);
a semiconductor laser diode mounted on the TEC, the semiconductor laser diode generating a modulated optical signal with a wavelength depending on a temperature of the semiconductor laser diode as controlled by the TEC;
a semiconductor optical amplifier (SOA) that amplifies the modulated optical signal output from the semiconductor laser diode; and
another TEC that mounts the SOA A thereon,
wherein the another TEC sets a temperature of the SOA higher than the temperature of the semiconductor laser diode.

2. The optical amplifying system of claim 1,
wherein the SOA is supplied with a driving current that raises the temperature of the SOA.

3. An optical amplifying system comprising:
a thermo-electric cooler (TEC);
a semiconductor laser diode mounted on the TEC, the semiconductor laser diode generating a modulated optical signal with wavelength depending on a temperature of the semiconductor laser diode as controlled by the TEC, the semiconductor laser diode including a gain region that generates laser light with the wavelength, and a modulating region that modulates the laser light generated in the gain region to provide a modulated optical signal; and
a semiconductor optical amplifier the amplifies the modulated optical signal output from the semiconductor laser diode,
wherein the SOA is integrated with the semiconductor laser diode and in front of the modulating region, the SOA and the gain region sandwiching the modulating region therebetween,
wherein the gain region and the modulating region are mounted on the TEC but the SOA overhangs from the TEC, and
wherein the SOA has a temperature thereof higher than the temperature of the semiconductor laser diode.

4. The optical amplifying system of claim 3,
wherein the semiconductor laser diode further integrates a waveguide region between the modulating region and the SOA, the waveguide region having a portion overlapping with the TEC and a rest portion overhanging from the TEC.

5. The optical amplifying system of claim 4,
further including another TEC that mounts the SOA and a portion of the rest portion of the waveguide region,
wherein the another TEC sets the temperature of the SOA higher than the temperature of the gain region and the modulating region of the semiconductor laser diode.

* * * * *